United States Patent [19]

Szwejkowski et al.

[11] Patent Number: 5,338,398
[45] Date of Patent: Aug. 16, 1994

[54] TUNGSTEN SILICIDE ETCH PROCESS SELECTIVE TO PHOTORESIST AND OXIDE

[75] Inventors: Chester A. Szwejkowski, Santa Cruz; Robert Lum, Hayward, both of Calif.; Thierry Fried, Grenoble, France

[73] Assignee: Applied Materials, Inc., Santa Clara, Calif.

[21] Appl. No.: 996,379

[22] Filed: Dec. 23, 1992

Related U.S. Application Data

[63] Continuation of Ser. No. 677,018, Mar. 28, 1991, abandoned.

[51] Int. Cl.$^5$ .............................................. H01L 21/00
[52] U.S. Cl. ...................... 156/655; 156/656; 156/657; 156/643; 156/646; 156/662
[58] Field of Search ............ 156/656, 662, 664, 643, 156/646, 657, 655

[56] References Cited

U.S. PATENT DOCUMENTS

| | | | |
|---|---|---|---|
| 4,465,532 | 8/1984 | Fukano | 156/643 |
| 4,668,338 | 5/1987 | Maydan et al. | 156/643 |
| 4,778,563 | 10/1988 | Stone | 156/643 |
| 4,785,962 | 11/1988 | Toshima | 220/260 |
| 4,786,360 | 11/1988 | Cote et al. | 156/646 |
| 4,789,426 | 12/1988 | Pipkin | 156/646 |
| 4,799,991 | 1/1989 | Dockrey | 156/646 |
| 4,818,334 | 4/1989 | Shwartzman et al. | 156/659.1 |
| 4,833,096 | 5/1989 | Huang et al. | 156/644 |
| 4,836,886 | 6/1989 | Daubenspeck | 156/643 |
| 4,842,683 | 6/1989 | Cheng et al. | 156/345 |
| 4,951,601 | 8/1990 | Maydan et al. | 118/719 |
| 5,024,722 | 6/1991 | Cathey | 156/646 |
| 5,110,411 | 5/1992 | Long | 156/643 |

FOREIGN PATENT DOCUMENTS 02094520  4/1990  Japan .

OTHER PUBLICATIONS

Lum, Robert T., et al., "Precision 5000 Etch: Tungsten Silicide Process Capability", *Etch News*, vol. VII, No. 1, Spring 1990, p. 1–18.

*Primary Examiner*—Brian E. Hearn
*Assistant Examiner*—George Goudreau
*Attorney, Agent, or Firm*—John P. Taylor

[57] ABSTRACT

A process for etching tungsten silicide on a semiconductor wafer in a vacuum etch chamber in the presence of a plasma is described using chlorine ($Cl_2$) and oxygen-bearing etchant gases in a ratio of not more that 20 volume % oxygen-bearing etchant gas, and preferably from about 6 to about 10 volume % oxygen-bearing etchant gas. The process is also capable of etching polysilicon and exhibits a high selectivity for both photoresist and oxide.

23 Claims, 2 Drawing Sheets

TUNGSTEN SILICIDE ETCH PROCESS SELECTIVE TO PHOTORESIST AND OXIDE

This is a continuation of copending application Ser. No. 07/677,018 filed on Mar. 28, 1991; abandoned.

BACKGROUND OF THE INVENTION

1. Field of the Invention

This invention relates to an improved process for etching tungsten silicide. More particularly, this invention relates to a tungsten silicide etch process which is highly selective to photoresist and oxide.

2. Description of the Related Art

The use of tungsten silicide over polysilicon as a gate contact or as an interconnect between circuit elements is becoming more prevalent in VLSI technologies as devices geometries become smaller. Tungsten silicide over polysilicon lowers the resistivity and this lower resistivity allows integrated circuit structure geometries to shrink while maintaining the desired performance improvements needed for advanced integrated circuit structures.

Fluorine-based chemistry such as $SF_6$ has been used to etch tungsten silicide. However, the tendency to undercut both the tungsten silicide and the underlying polysilicon has been a major drawback of the use of this etching system. The use of a $BCl_3/Cl_2$ etch system to etch tungsten silicide has also been proposed in an article by Lum and Bondur entitled "Precision 5000 Etch: Tungsten Silicide Process Capability", published in Applied Materials Etch Bulletin Volume VII, Number 1, Spring 1990. In that article the use of a multi-step process is described wherein $BCl_3/Cl_2$ chemistry is used to etch tungsten silicide layer and part of the underlying polysilicon until the entire tungsten silicide film is removed, after which a standard polysilicon etch may be carried out using standard $HBr/Cl_2$ chemistry.

However, the use of a $BCl_3$ gas is sometimes not preferred because of the low purity of the gas, which may result in the deposition of particles on the wafer; and because of the low vapor pressure of the gas, which may cause it to condense in the apparatus used to convey the gas to the etch chamber.

It would, therefore, be desirable to provide a tungsten silicide etch system which uses gases which will not deposit particles on the wafer, will not easily condense in the apparatus used to deliver the gas to the etch chamber, and which will have a good selectivity for both photoresist and oxide, while permitting the etching of both tungsten silicide and polysilicon.

SUMMARY OF THE INVENTION

The tungsten silicide etch process of the invention uses a combination of $Cl_2$ and an oxygen-bearing gas, such as oxygen ($O_2$) or carbon dioxide ($CO_2$), to selectively etch tungsten silicide wherein the amount of oxygen-bearing gas present in the etch gas mixture does not exceed about 20 volume percent. The selectivity of the etch system to either oxide or photoresist is higher than that of the prior art $BCl_3/Cl_2$ etch system and the etchant gases used are commercially available at a higher purity than $BCl_3$, resulting in less undesirable particle formation during the etching process. The etchant system of the invention is also a good etchant for polysilicon. This plus the etch system's high selectivity to oxide permits the removal of both tungsten silicide and polysilicon without changing etchants if desired.

DETAILED DESCRIPTION OF THE INVENTION

Figure 1:
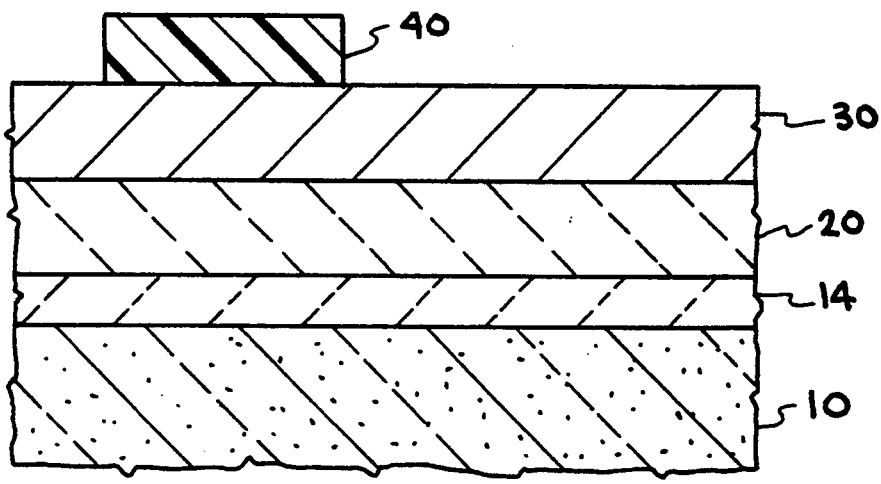
FIG. 1 is a fragmentary vertical cross-sectional view of an integrated circuit structure showing a patterned photoresist mask applied over a tungsten silicide layer which has been formed on a polysilicon layer, leaving an exposed portion of the tungsten silicide layer having the cross-section area of an intended gate electrode.

The invention comprises an improved process for the RIE etching of tungsten silicide on a semiconductor wafer in a vacuum etch chamber using an etchant gas comprising a mixture of chlorine ($Cl_2$) and oxygen-bearing gas. The etch may be carried out in vacuum apparatus such as shown in Toshima U.S. Pat. No. 4,785,962, Cheng et al. U.S. Pat. No. 4,842,683, and Maydan et al. U.S. Pat. No. 4,951,601, all assigned to the assignee of this invention, and cross-reference to all of which is hereby made.

The chlorine and oxygen-bearing gases used in the process of the invention will comprise gases having a minimum purity of at least about 99.9 volume %, and preferably at least about 99.99 volume %, in contrast to the relatively impure $BCl_3$ used in the $BCl_3/Cl_2$ etch system of the prior art. The chlorine and oxygen-bearing gases in the etchant gas mixture are present in a ratio of from about 2 volume % to about 20 volume % oxygen-bearing gas and from about 80 volume % to about 98 volume % chlorine. Preferably the chlorine and oxygen-bearing gases etchant gases are present in a ratio of from about 6 to about 10 volume % oxygen-bearing gas to from about 90 to about 94 volume % chlorine gas, with the typical ratio being 8 volume % oxygen-bearing gas ans 92 volume % chlorine gas.

The oxygen-bearing gas may comprise oxygen ($O_2$), carbon dioxide ($CO_2$) or any other oxygen-bearing gas. Typically, the oxygen-bearing gas will comprise oxygen ($O_2$), and the oxygen-bearing gas will sometimes hereinafter be referred to as oxygen, by way of illustration and not of limitation.

The etchant gas mixture may be used by itself or optionally with one or more inert carrier gases such as, for example, helium or argon. When the etchant gases are used with one or more carrier gases, the volume of the etchant gas mixture should comprise at least about 50 volume % of the total mixture of etchant and carrier gases to avoid excess dilution of the etchant gases.

The etchant gases may be mixed with one another, and with the optional carrier gas or gases, in the grounded gas showerhead in the vacuum etch chamber, or the etchant gases, and optionally the carrier gas or gases, when used, may be premixed in an external vessel and then piped as a mixture to the showerhead through a single pipe. The latter procedure may be desirable in some instances to provide more accurate control of the ratio of chlorine to oxygen-bearing gas, since it has been found that the use of an amount of an oxygen-bearing gas in excess of about 10 volume % of the etchant gas mixture may result in a reduction of the tungsten silicide etch rate.

Alternatively, the carrier gas may be premixed only with the oxygen-bearing gas, while using the chlorine gas without dilution. For example, a mixture of oxygen ($O_2$) and helium ($He_2$) in ratio of 30 volume % oxygen and 70 volume % helium, may be flowed into either the premixing chamber or the showerhead to be mixed with the chlorine gas therein.

The total gas flow of etchant gases (or etchant gases and carrier gases) into the vacuum etch chamber, when a chamber volume of about 3 liters is used, should range from about 40 to about 100 standard cubic centimeters/minute (sccm), depending upon the size of the wafer. The flow rate of the etchant gases, therefore, may be expressed as a rate equivalent to the flow of from about 40 to about 100 sccm into a 3 liter vacuum chamber.

The pressure in the vacuum etch chamber during the etch process of the invention may range from about 10 milliTorr to about 100 milliTorr, and typically will be maintained at about 20 milliTorr.

The wafer to be etched is conventionally mounted in the vacuum chamber on a cathode support which is connected to the negative terminal of a grounded power supply. During the etch, a plasma is ignited between the cathode and the grounded walls of the chamber and the grounded showerhead. The plasma is maintained during the etch at a power level ranging from about 100 to about 600 watts, depending upon the wafer size. For example, for a 6 inch diameter wafer, typically the plasma power will be maintained at about 300 watts during the etch.

The cathode or susceptor, during the etch, is maintained at a temperature of at least about 50° C., typically at about 65° C., for example, by a heater in the cathode maintained at this temperature, as is well known to those skilled in the art. Higher temperatures may be used, but may not, however, be desirable for other reasons.

Magnetic enhancement may be optionally used during the etch by immersing the wafer being etched in a magnetic field having an axis parallel to the plane of the wafer as is known to those skilled in the art. Such magnetic enhancement is described in Maydan et al. U.S. Pat. No. 4,668,338 and the aforementioned Cheng et al. U.S. Pat. No. 4,842,683, both assigned to the assignee of this invention, and cross-reference to both of which is hereby made. The magnetic field strength in which the wafer to be etched may be optionally immersed will vary from 0 to about 150 gauss, typically about 100 gauss.

The progress of the tungsten silicide/polysilicon etch process of the invention may be monitored optically, by monitoring etch byproduct emission intensities, e.g., monitoring the 470.5 nm emission line during the etch process.

Figure 2:
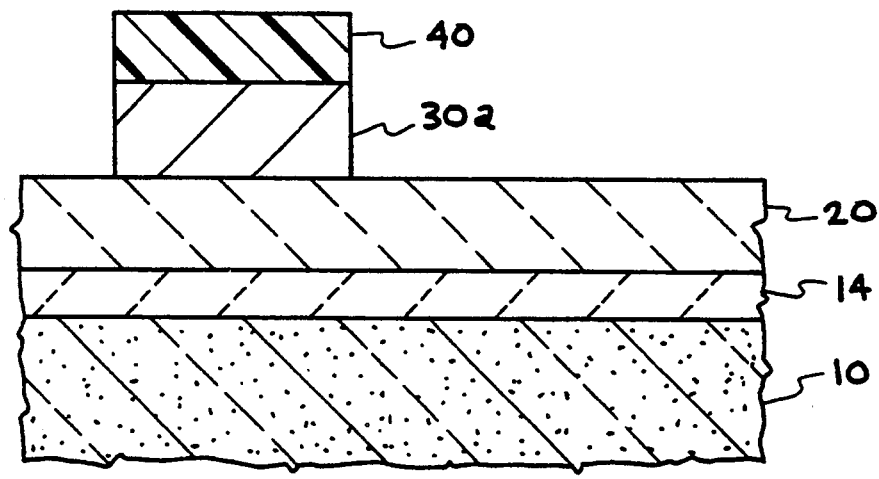
FIG. 2 is a fragmentary vertical cross-sectional view of the integrated circuit structure of FIG. 1 showing the removal of the exposed portion of the tungsten silicide layer shown in FIG. 1 by the etch process of the invention.
Figure 3:
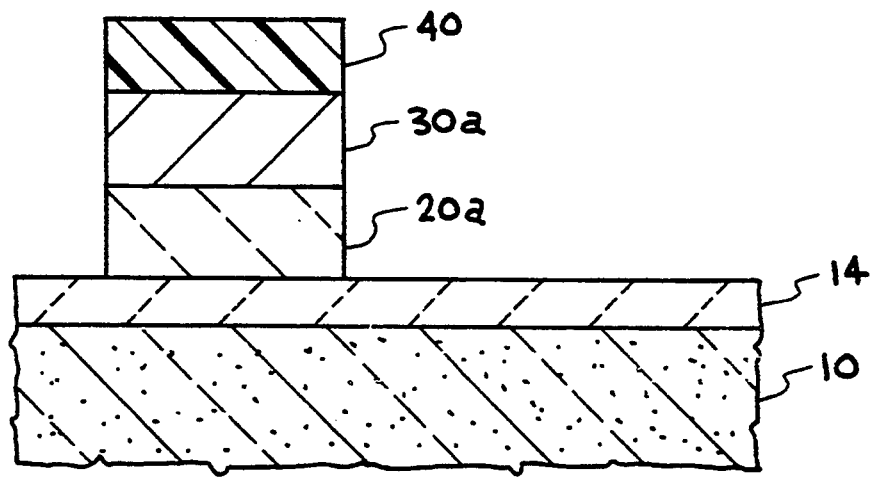
FIG. 3 is a fragmentary vertical cross-sectional view of the integrated circuit structure of FIGS. 1 and 2 showing the etch removal of the polysilicon layer exposed in FIG. 2 by the etch process of the invention.

Referring now to FIGS. 1–3, a typical integrated circuit structure is shown in FIG. 1, wherein a tungsten silicide/polysilicon gate electrode is to be formed. A semiconductor wafer 10, which may be a silicon wafer and which may already have portions of an integrated circuit structure formed therein, has a gate oxide layer 14 formed thereon. Over gate oxide layer 14, a polysilicon layer 20 has been deposited, and a tungsten silicide layer 30 has been formed over polysilicon layer 20. A photoresist mask 40 is shown on tungsten silicide layer 30 defining a gate electrode to be formed over gate oxide layer 14.

In accordance with the practice of the invention, the wafer shown in FIG. 1 is mounted in a vacuum etch chamber maintained at a vacuum of typically about 20 milliTorr, and an etchant gas mixture typically of from 90 to 94 volume % $Cl_2$ and 6 to 10 volume % $O_2$ may be flowed into the chamber, at a rate equivalent to the flow of from about 40 to about 100 sccm into a 3 liter vacuum chamber, with or without an inert carrier gas. A plasma is ignited in the etch chamber and then maintained, during the flow of etchant gas into the chamber, at a power level ranging from about 100 to about 600 watts (depending upon the wafer size) during the etch. As also previously discussed, optionally the wafer may be immersed in a magnetic field parallel to the plane of the wafer at a magnetic strength ranging from 0 to about 150 gauss.

As shown in FIG. 2, the etch process of the invention will remove all of the unmasked (exposed) tungsten silicide, leaving only tungsten silicide portion 30a, without any significant erosion or undercutting of photoresist mask 40, thus illustrating the selectivity of the etch process of the invention to photoresist materials. While the etch process of the invention may be further used to remove the exposed portions of underlying polysilicon layer 20, it is possible to stop the $Cl_2/O_2$ etch process of the invention at this point and to remove the exposed polysilicon using conventional polysilicon etch systems such as, for example, standard $HBr/Cl_2$ chemistry.

However, because of the ability of the etch process of the invention to also etch polysilicon, and the selectivity of the etch process of the invention with respect to oxide, it may be advantageous to simply continue etching, using the etch process of the invention, until the polysilicon is also removed, stopping the etch when gate oxide layer 14 is reached using, for example, optical monitoring of the spectral emission lines.

In either event, the result is the structure shown in FIG. 3, with both the unmasked portion of tungsten silicide layer 30 removed, leaving only tungsten silicide gate electrode contact portion 30a, and the exposed portion of polysilicon layer 20 also removed, leaving only polysilicon gate electrode contact portion 20a.

Figure 4:
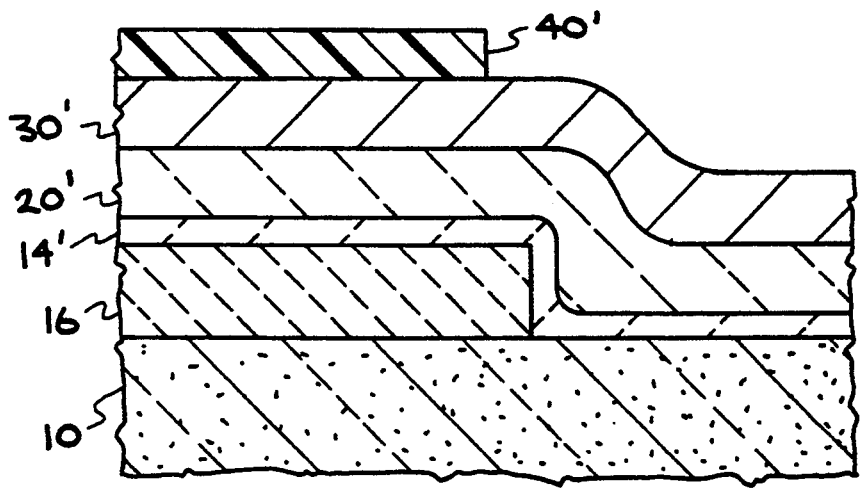
FIG. 4 is a fragmentary vertical cross-sectional view of an integrated circuit structure having a raised field oxide step formed thereon under the polysilicon layer.
Figure 5:
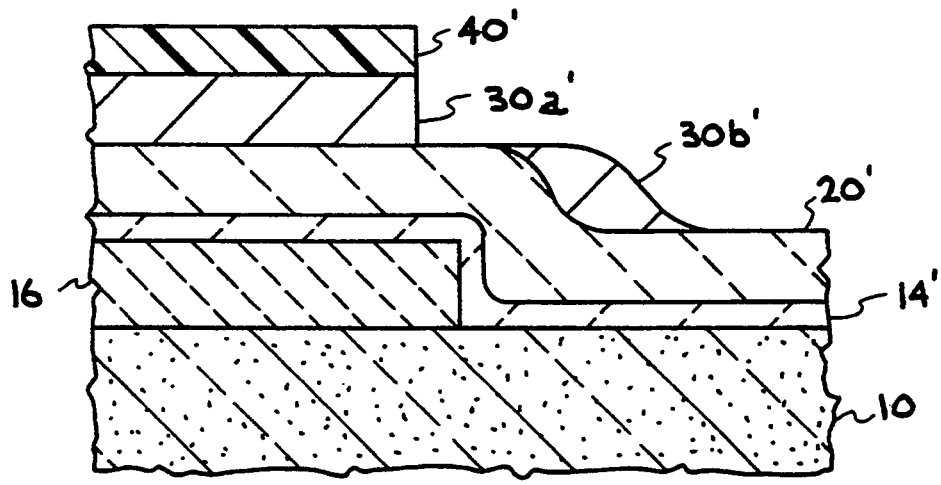
FIG. 5 is a fragmentary vertical cross-sectional view of the stepped integrated circuit structure of FIG. 4 after removal of the bulk of the tungsten silicide except on the side of the step, by the etch process of the invention.
Figure 6:
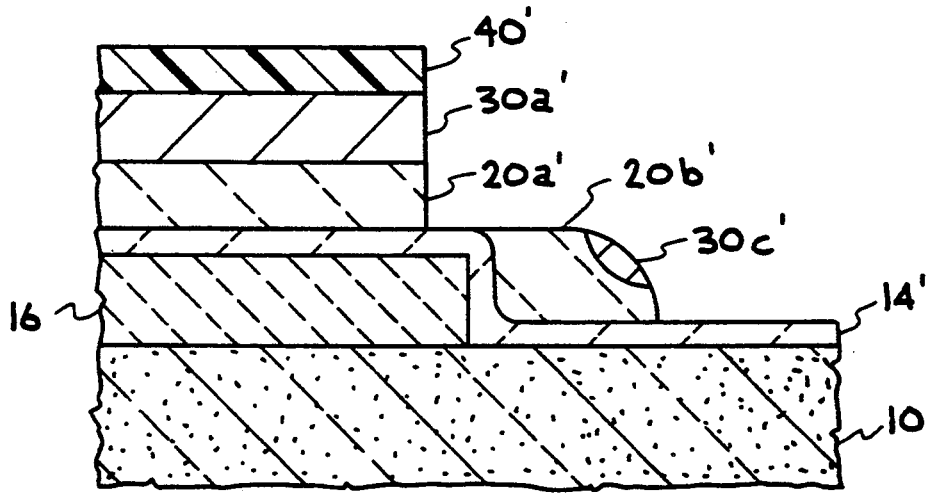
FIG. 6 is a fragmentary vertical cross-sectional view of the stepped integrated circuit structure of FIGS. 4 and 5 after removal of all of the tungsten silicide, as well as the polysilicon, by the etch process of the invention, resulting in exposed oxide.

Turning now to FIGS. 4–6, certain advantages of the etch process of the invention are illustrated with respect to its ability to etch both tungsten silicide and polysilicon, while maintaining a high selectivity to oxide. As seen in FIG. 4, a field oxide step portion 16 is formed over semiconductor wafer 10, prior to formation of field oxide layer 14'. Polysilicon layer 20' is then deposited over field oxide layer 14' and tungsten silicide layer 30' is formed over polysilicon layer 20'. Photoresist mask 40' is then placed over the structure to define, for example, an tungsten silicide/polysilicon interconnect.

In this instance, when the unmasked horizontal portions of tungsten silicide layer 30' have been completely removed, leaving contact portion 30a' beneath photoresist mask 40', as shown in FIG. 5, there still remains tungsten silicide portion 30b' on the side of the step, due to the anisotropic nature of the etch. This requires further tungsten silicide etching, either before etching polysilicon layer 20', or while simultaneously removing the unmasked (exposed) portions of polysilicon layer 20'. Using the etch process of the invention, such simultaneous tungsten silicide/polysilicon etching is possible.

Further etching of the structure will then result in the removal of the unmasked (exposed) horizontal portions of polysilicon layer 20', as shown in FIG. 6, leaving tungsten silicide contact portion 30a' and polysilicon contact portion 20a' beneath it. The etch will also remove most of tungsten silicide portion 30b', leaving only tungsten silicide portion 30c' and polysilicon portion 20b' on the side of the step, again because of the anisotropic nature of the etch.

At this point, the selectivity of the etch process of the invention to oxide, as well as its ability to etch both tungsten silicide and polysilicon, will be seen to be very valuable, since horizontal portions of gate oxide 14' (above oxide step 16 and above semiconductor wafer 10) are now exposed to the etch gases, while both tungsten silicide portion 30c' and polysilicon portion 30b' must still be further etched to completely remove them.

If, for example, the $BCl_3/Cl_2$ etch system of the prior art would be used in connection with the etching of such a structure, it would have much less selectivity to oxide. Thus, further etching to remove silicide portion 30c' and polysilicon portion 20b', using a prior art $BCl_3/Cl_2$ system, would risk possible etching away of gate oxide layer 14' and exposure, for example, of underlying semiconductor wafer 10 to the etch gases.

However, the etch process of the invention has been found to provide sufficient selectivity to oxide, for example, so that if a 2500 Angstrom layer of polysilicon and a 2500 Angstrom of tungsten silicide are formed over a typical 250 Angstrom gate oxide and a 2500 Angstrom step, all of the tungsten silicide and polysilicon may be cleared from the side of the step without breaking through the gate oxide formed over the wafer and step.

Thus, the invention provides an improved tungsten silicide etch process wherein both tungsten silicide and polysilicon may be etched in an etch process having a high selectivity to both photoresist and oxide, using gaseous components of the etch available in high purity form which will not result in the undesirable formation of particles on the wafer surface and which will not condense at room temperature in the lines used to bring the etchant gases to the vacuum etch chamber.

Having thus described the invention what is claimed is:

1. A plasma etching process for etching both tungsten silicide and polysilicon layers on a semiconductor wafer using chlorine gas and an oxygen-bearing etchant gas, in a ratio of from 90 to 94 volume % chlorine and from 6 to 10 volume % oxygen-bearing gas, characterized by a high selectivity to both photoresist and silicon oxide which comprises;
    a) mounting on a wafer support platform in a vacuum etching chamber a semiconductor wafer having an oxide portion formed thereon, polysilicon over said oxide, tungsten silicide over said polysilicon, and a photoresist mask over said tungsten silicide;
    b) flowing into said chamber;
        i) from 50 to 100 volume % of an etchant gas mixture consisting essentially of chlorine gas and an oxygen-bearing gas in a volume ratio of from 90 to 94 volume % chlorine and from 6 to 10 volume % oxygen-bearing gas; and
        ii) from 0 to 50 volume % of one or more inert carrier gases;
    c) igniting a plasma in said vacuum etching chamber, between said cathode wafer support and the grounded walls of said vacuum chamber while said etchant gas mixture is flowing through said chamber to etch both said tungsten silicide and said polysilicon through said photoresist mask down to said underlying oxide portion on said wafer.

2. The etching process of claim 1 wherein said plasma is maintained during said flow of etchant gases into said chamber at a power level ranging from 100 watts to 600 watts.

3. The etching process of claim 1 wherein said oxygen-bearing gas in said etchant gases is selected from the group consisting of oxygen ($O_2$) and carbon dioxide ($CO_2$).

4. The etching process of claim 3 wherein said oxygen-bearing gas in said etchant gases consists of oxygen.

5. The etching process of claim 3 wherein said oxygen-bearing gas in said etchant gases consists of carbon dioxide.

6. The etching process of claim 3 wherein said inert carrier gas is present in an amount of up to 50 volume % of the total gases.

7. A plasma etching process for etching tungsten silicide using an etchant gas characterized by a high selectivity to both photoresist and silicon oxide which comprises:
    a) a) mounting on a wafer support platform in a vacuum etching chamber a semiconductor wafer having an oxide portion, a tungsten silicide portion, and a photoresist portion;
    b) flowing into said chamber an etchant gas mixture consisting essentially of chlorine gas and an oxygen-bearing gas; and
    c) igniting a plasma in said vacuum etching chamber, between said cathode wafer support and the grounded walls of said vacuum chamber while said etchant gas mixture is flowing through said chamber to etch said tungsten silicide on said wafer.

8. The etching process of claim 3 wherein said etchant gases are flowed into said vacuum etching chamber at a flow rate equivalent to a total flow rate of from 40 to 100 sccm into a 3 liter vacuum chamber.

9. The etching process of claim 3 wherein the pressure in said vacuum chamber is maintained within a range of from 10 milliTorr to 100 milliTorr.

10. The etching process of claim 3 wherein said cathode wafer support is maintained at a temperature of at least 50° C.

11. The etching process of claim 3 wherein said wafer is optionally immersed in a magnetic field having a magnetic axis parallel to the plane of the wafer during said etching step.

12. The etching process of claim 11 wherein said optional magnetic field has a field strength of from 0 to 150 gauss.

13. The etching process of claim 3 wherein said chlorine and oxygen-bearing etchant gases have a minimum purity of at least 99.9 volume %.

14. The etching process of claim 13 wherein said chlorine and oxygen-bearing etchant gases have a minimum purity of at least 99.99 volume %.

15. A plasma etching process for etching both tungsten silicide and polysilicon using an etchant gas characterized by a high selectivity to both photoresist and silicon oxide which comprises:
    a) mounting on a wafer support platform in a vacuum etching chamber a semiconductor wafer having an oxide portion, a tungsten silicide portion, a polysilicon portion, and a photoresist portion;
    b) flowing into said chamber an etchant gas mixture consisting essentially of chlorine gas and an oxygen-bearing gas; and
    c) igniting a plasma in said vacuum etching chamber, between said cathode wafer support and the grounded walls of said vacuum chamber while said etchant gas mixture is flowing through said chamber to etch said tungsten silicide and said polysilicon on said wafer.

16. A process for patterning, in a single etch step in a vacuum etch chamber through a photoresist mask, layers of tungsten silicone and polysilicon on an oxide layer on a semiconductor wafer mounted on a cathode in said vacuum chamber, characterized by a high selectivity to both photoresist and silicon oxide, which comprises flowing into said chamber;
    a) from 50 to 100 volume % of an etchant gas mixture consisting essentially of chlorine and oxygen-bearing etchant gases in a ratio of from 2 to 20 volume % oxygen-bearing gas to from 80 to 98 volume % chlorine gas; and
    b) from 0 to 50 volume % of one or more inert carrier gases;
while maintaining a plasma, between said cathode wafer support and the grounded walls of said vacuum chamber whereby both said tungsten silicide and said polysilicon layers will be etched without damage to said underlying oxide layer and without eroding said photoresist layer sufficiently to damage said tungsten silicide layer beneath said photoresist mask.

17. The etching process of claim 16 wherein said etchant gases are flowed into a vacuum etching chamber at a flow rate equivalent to a total flow rate of from 40 to 100 sccm into a 3 liter vacuum chamber.

18. The etching process of claim 16 wherein the pressure in said vacuum chamber is maintained within a range of from 10 milliTorr to 100 milliTorr.

19. The etching process of claim 16 wherein said cathode wafer support is maintained at a temperature of at least 50° C.

20. The etching process of claim 16 wherein said wafer is optionally immersed in a magnetic field having a magnetic axis parallel to the plane of the wafer during said etching step and a field strength ranging from 0 to 150 gauss.

21. The etching process of claim 16 wherein said oxygen-bearing etchant gas consists of oxygen ($O_2$).

22. A process for etching both a layer of tungsten silicide masked with a photoresist mask and an underlying layer of polysilicon which is formed over an oxide layer on a semiconductor wafer mounted on a cathode in a vacuum chamber which comprises:
    a) flowing into said chamber, at a rate equivalent to from 40 to 100 sccm into a 3 liter chamber;
        i) from 50 to 100 volume % of an etchant gas mixture consisting essentially of chlorine and oxygen-bearing etchant gases in a ratio of from 6 to 10 volume % oxygen-bearing gas and from 90 to 94 volume % chlorine in said etchant gases; and
        ii) from 0 to 50 volume percent of one or more inert carrier gases;
    b) igniting a plasma, between said cathode wafer support and the grounded walls of said vacuum chamber, and maintaining said plasma at a power level ranging from 100 watts to 600 watts while said etchant gases are flowing into said vacuum chamber;
    c) Maintaining said vacuum chamber at a pressure ranging from 10 milliTorr to 100 milliTorr while said etchant gases are flowing into said vacuum chamber;
    d) maintaining said cathode wafer support at a temperature of at least 50° C. while said etchant gases are flowing into said vacuum chamber; and
    e) immersing said wafer in a magnetic field having a magnetic axis parallel to the plane of said wafer and a magnetic field strength ranging from 0 to 150 gauss;
to thereby selectively remove said tungsten silicide and said polysilicon without removing said photoresist mask or said underlying oxide layer.

23. The etching process of claim 22 wherein said oxygen-bearing etchant gas consists of oxygen ($O_2$).

* * * * *